United States Patent
Greim et al.

(10) Patent No.: US 10,690,736 B2
(45) Date of Patent: Jun. 23, 2020

(54) LOCAL COIL FOR MAGNETIC RESONANCE TOMOGRAPHY SYSTEM

(71) Applicant: Siemens Healthcare GmbH, Erlangen (DE)

(72) Inventors: Helmut Greim, Adelsdorf (DE); Robert Rehner, Neunkirchen am Brand (DE); Markus Vester, Nürnberg (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 16/259,519

(22) Filed: Jan. 28, 2019

(65) Prior Publication Data

US 2019/0235034 A1    Aug. 1, 2019

(30) Foreign Application Priority Data

Jan. 31, 2018  (DE) .................. 10 2018 201 476

(51) Int. Cl.
*G01R 33/34*      (2006.01)
*G01R 33/3415*  (2006.01)
*G01R 33/341*    (2006.01)
*G01R 33/36*      (2006.01)
*G01R 33/48*      (2006.01)

(52) U.S. Cl.
CPC ....... *G01R 33/3415* (2013.01); *G01R 33/341* (2013.01); *G01R 33/34007* (2013.01); *G01R 33/3614* (2013.01); *G01R 33/3657* (2013.01); *G01R 33/48* (2013.01)

(58) Field of Classification Search
CPC .......... G01R 33/3415; G01R 33/34007; G01R 33/3657; G01R 33/341; G01R 33/48; G01R 33/3614
See application file for complete search history.

(56) References Cited

U.S. PATENT DOCUMENTS

| | | | | |
|---|---|---|---|---|
| 4,083,006 A | * | 4/1978 | Yokoshima | ............ G01R 29/00 343/703 |
| 4,620,155 A | * | 10/1986 | Edelstein | ............. G08B 13/196 324/318 |
| 4,691,163 A | * | 9/1987 | Blass | ................. G01R 33/3635 324/309 |
| 4,746,866 A | | 5/1988 | Roschmann | |

(Continued)

FOREIGN PATENT DOCUMENTS

| | | |
|---|---|---|
| DE | 3538952 A1 | 5/1987 |
| DE | 102004006322 A1 | 11/2005 |

(Continued)

OTHER PUBLICATIONS

"Inductance"—Wikipedia; https://en.wikipedia.org/w/index.php?title=Inductance&oldid=773694810; Version of Apr. 3, 2017. pp. 1-14.

(Continued)

*Primary Examiner* — G. M. A Hyder

(74) *Attorney, Agent, or Firm* — Lempia Summerfield Katz LLC

(57) ABSTRACT

A local coil for a magnetic resonance tomography system is provided. The local coil has a coil winding and a preamplifier connected electrically thereto. The coil winding has a plurality of coil segments that are coupled capacitively to one another.

10 Claims, 3 Drawing Sheets

(56) References Cited

U.S. PATENT DOCUMENTS

| | | | | |
|---|---|---|---|---|
| 4,816,766 A * | 3/1989 | Zabel | ............... | G01R 33/341 |
| | | | | 324/318 |
| 5,049,821 A * | 9/1991 | Duensing | ............ | G01R 33/341 |
| | | | | 324/318 |
| 5,168,230 A * | 12/1992 | Hashoian | ............ | G01R 33/341 |
| | | | | 324/318 |
| 8,581,588 B2 * | 11/2013 | Driesel | ............ | G01R 33/3415 |
| | | | | 324/307 |
| 2007/0159176 A1 * | 7/2007 | Lanz | ............... | G01R 33/34515 |
| | | | | 324/322 |
| 2011/0043209 A1 * | 2/2011 | Zhu | ..................... | G01R 33/365 |
| | | | | 324/322 |
| 2013/0271143 A1 | 10/2013 | Vester | | |
| 2015/0015262 A1 * | 1/2015 | Greim | ................. | G01R 33/385 |
| | | | | 324/322 |
| 2015/0048823 A1 | 2/2015 | Fackelmeier | | |
| 2015/0323620 A1 | 11/2015 | Yang | | |
| 2017/0123024 A1 * | 5/2017 | Li | ................... | G01R 33/34046 |

FOREIGN PATENT DOCUMENTS

| | | |
|---|---|---|
| DE | 102006042996 A1 | 10/2007 |
| DE | 102012206008 A1 | 10/2013 |
| DE | 102013216376 A1 | 2/2015 |

OTHER PUBLICATIONS

E-PHEMT SAV-541+ Datasheet; https://ww2.minicircuits.com/pdfs/SAV-541+.pdf; Feb. 26, 2018. pp. 1-13.

German Office Action for German Application No. 10 2018 201 476.0 dated Oct. 19, 2018.

* cited by examiner

LOCAL COIL FOR MAGNETIC RESONANCE TOMOGRAPHY SYSTEM

CROSS REFERENCE TO RELATED APPLICATIONS

This application claims the benefit of DE 10 2018 201 476.0 filed on Jan. 31, 2018, which is hereby incorporated by reference in its entirety.

FIELD

Embodiments relate to a local coil for a magnetic resonance tomography system.

BACKGROUND

Magnetic resonance tomography systems are imaging apparatuses, that in order to map an examination object, align the nuclear spins of the examination object with a strong external magnetic field and by a magnetic alternating field excite the nuclear spins for precession about this alignment. The precession or return of the spins from the excited state into a state with less energy in turn generates, as a response, a magnetic alternating field, also referred to as magnetic resonance signal, that is received by an antenna.

With the aid of magnetic gradient fields, a spatial encoding is impressed onto the signals, that permits an assignment of the received signal to a volume element. The received signal is evaluated and a three-dimensional imaging representation of the examination object is provided. The generated representation specifies a spatial density distribution of the spins.

Magnetic fields of 1.5 tesla, 3 tesla or higher as a BO field for alignment of the nuclear spins may be used in magnetic resonance tomography systems. Since the Larmor frequency increases linearly with the BO field strength, the Larmor frequency moves into ranges of 70 MHz to 150 MHz and above. Noise portions reduce with a higher frequency. However, the magnets required are at the same time becoming increasingly heavier and more expensive on account of growing inner forces. The energies stored in the fields are also increasing, so that ever more complicated safety measures are taken in the event of a failure of the superconductivity.

There is therefore an interest in reducing the necessary costs for the field magnets for cost-effective magnetic resonance tomography systems.

With lower BO field strengths and the correspondingly lower Larmor frequencies, the ratio of the size of the local coil to the wavelength is even more unfavorable. A resonance for the receiving process may only be achieved by a number of what are known as shortening capacitors, that require corresponding space and increase costs.

SUMMARY AND DESCRIPTION

The scope of the present disclosure is defined solely by the appended claims and is not affected to any degree by the statements within this summary. The present embodiments may obviate one or more of the drawbacks or limitations in the related art.

Embodiments provide a local coil matrix that is cost-effective and easy to produce.

Embodiments include a first coil winding and a first preamplifier connected electrically thereto. The first coil winding includes a plurality of coil segments that are coupled with one another in a capacitive and non-ohmic manner. Coil segments may include joined conductor sections that extend at least partially along the coil winding.

By provisioning the capacitances by the coil segments, it is possible to dispense with separate capacitors and to provision the coils in a more compact and favorable manner.

In an embodiment of the local coil, conductors of at least two different coil segments are arranged adjacent to one another along a substantial portion of their longitudinal extent. A portion of more than 10%, 20%, 50% or 70% of the length of the segment may be considered to be a substantial portion. A distance provided flexibly or rigidly by an insulating material, for instance by an insulating varnish or a conductor board as a carrier material, for instance a distance of less than 0.1 mm, 0.2 mm, 0.5 mm or 1 mm, may be considered as adjacent.

A plurality of coil segments may be adjacent to one another. For example, the coil winding may be provided from a type of litz wire, the individual filaments of which are insulated from one another and are repeatedly interrupted across the periphery of the coil winding so that a plurality of segments that are insulated ohmically from one another is provided.

The adjacent arrangement of the coil segments represents a capacitive coupling that replaces coupling capacitors in a space-saving manner.

In an embodiment of the local coil, the first coil winding includes a coaxial cable. The electrical conductors of the two different coil segments are each provided by an external conductor and an internal conductor of the coaxial cable.

Adjacent coil segments may also be provided in a cost-effective manner by external conductors and internal conductors of a coaxial cable. External and/or internal conductors may be divided into different segments as a result of interruptions at different points along the longitudinal extent that are offset with respect to one another, the segments only being arranged adjacent to one another partially, and not across the entire length as a result of the dielectric.

In an embodiment of the local coil, the internal conductor of the coaxial cable is a loop that is closed up to a point of interruption. The point of interruption may be bridged by a closeable switch.

The resonance frequency or impedance of the local coil winding may be changed by the closeable switch and the local coil may therefore be detuned for the purpose of protecting the patient and the preamplifier.

In an embodiment of the local coil, the closeable switch is a PIN diode or a MEMS switch.

Depending on the arrangement of the interruption relative to the feed point, the maximum detuning may be achieved when the switch is closed or open. A PIN diode may therefore be arranged opposite the feed point, so that a high forward current for detuning purposes is only required during the excitation pulse, whereas a switch such as a MEMS is also conceivable in the vicinity of the feed point without an energy consumption in the switched mode.

DETAILED DESCRIPTION

Figure 1:
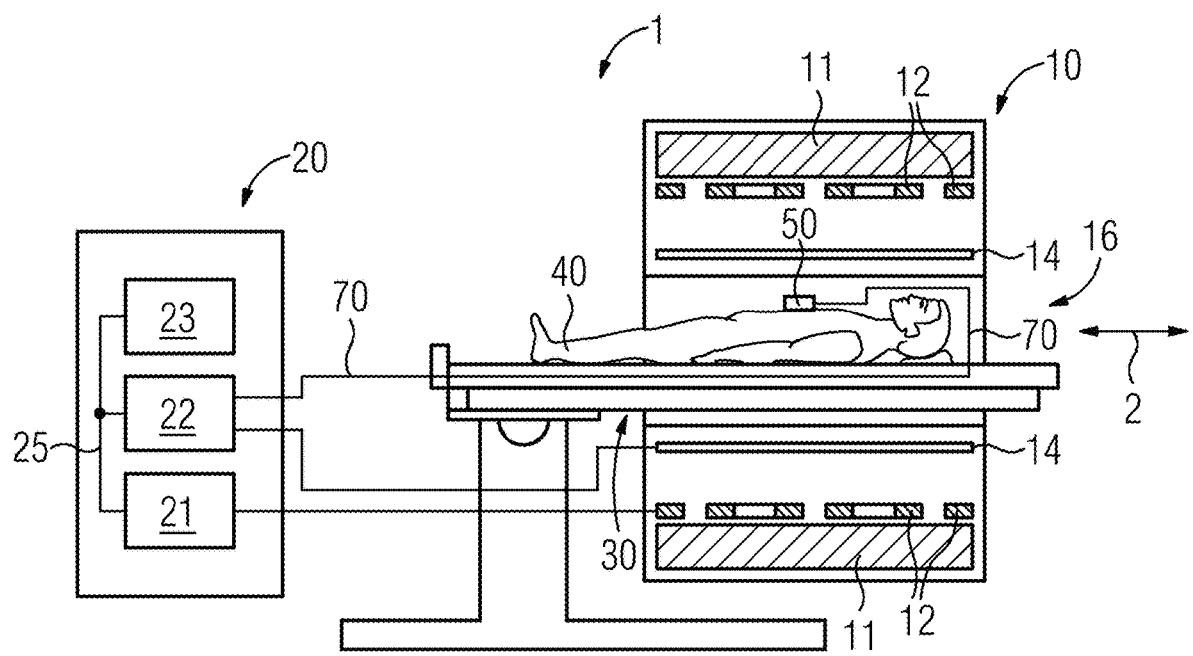
FIG. 1 depicts a schematic representation of a magnetic resonance tomography system with a local coil according to an embodiment.

FIG. 1 depicts a schematic representation of an embodiment of a magnetic resonance tomography system 1 with a local coil.

A magnet unit 10 includes a field magnet 11 that generates a static magnetic field BO for aligning nuclear spins of samples or in a body of a patient 40 in a receiving area. The receiving area is arranged in a patient tunnel 16, that extends in a longitudinal direction 2 through the magnet unit 10. In an embodiment of the magnetic resonance tomography system 1, the field magnet 11 is a superconducting magnet. Permanent magnets or electromagnets with normal-conducting coils may also be used.

The magnet unit 10 also includes gradient coils 12 that are configured to overlay the magnetic field BO with variable magnetic fields in three spatial directions for the spatial differentiation of the acquired imaging regions in the examination volume. The gradient coils 12 may be coils made of normal-conducting wires that may generate fields orthogonal to one another in the examination volume.

The magnet unit 10 includes a body coil 14 that is configured to release a radio-frequency signal fed via a signal line into the examination volume and to receive resonance signals emitted by the patient 40 and output the same via a signal line. The magnetic resonance tomography system also includes one or more local coils 50 that are arranged in the patient tunnel 16 close to the patient 40. The local coil 50 may have one or more coil windings 51. The local coils 50 are described in more detail with reference to the following FIGS. 2 to 5.

A control unit 20 supplies the magnet unit 10 with the various signals for the gradient coils 12 and the body coil 14 and evaluates the signals received.

The control unit 20 includes a gradient control 21 that is configured to provide the gradient coils 12 with variable currents via supply lines. The variable currents provide the desired gradient fields in the examination volume on a temporally coordinated basis.

The control unit 20 also includes a radio-frequency unit 22 that is configured to generate a radio-frequency pulse with a predetermined time characteristic, amplitude, and spectral power distribution to excite a magnetic resonance of the nuclear spins in the patient 40. Pulse powers in the kilowatt range may be achieved. The radio-frequency unit 22 may include a radio-frequency generator that may be implemented as a frequency synthesizer, for example, that is controlled by numerical values. The individual units are connected to one another by a signal bus 25.

The radio-frequency signal generated by the radio-frequency unit 22 is input via a signal link to the body coil 14 and radiated into the patient tunnel 16. An emission of the radio-frequency signal via a local coil 50 that is arranged on the patient 40 is also possible.

The local coil 50 may then receive a magnetic resonance signal from the body of the patient 40, since, due to the minimal distance, the signal-to-noise ratio (SNR) of the local coil 50 is better than upon receipt by the body coil 14. The MR signal received by the local coil 50 is prepared in the local coil 50 and forwarded to the radio-frequency unit 22 of the magnetic resonance tomography system 1 for evaluation and image detection purposes. Similarly, the signal connection 70 may be used, but separate signal connections or a wireless transmission may also be used.

Figure 2:
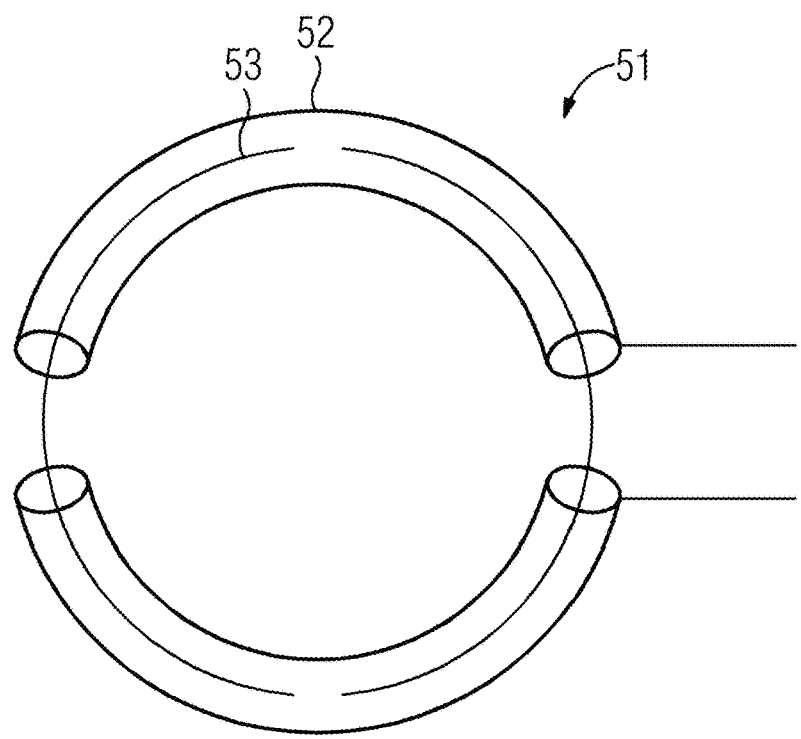
FIG. 2 depicts a schematic representation of a coil winding of a local coil according to an embodiment.

FIG. 2 shows an exemplary coil winding 51 of a local coil 50. The coil winding 51 includes a number of coil segments 52, 53. The first coil segment 52 is formed by, for example, an external conductor of a coaxial cable, and the second coil segment 53 is formed by, for example, the internal conductor of the coaxial cable. Both coil segments 52, 53 are separated by a dielectric. The first coil segment 52, the second coil segment 53, and the dielectric therebetween form a capacitance that connects the first coil segment 52 and the second coil segment 53 as extension capacitance electrically with one another.

A number of coil segments 52, 53 including alternately external conductor and internal conductor may be connected to one another (e.g., connected in series). The internal conductor within the coaxial cable may be interrupted at one or more points to ohmically separate the segments. The segments extend along the coil winding. The external conductor and/or the internal conductor is interrupted at different points along the coil winding 51, so that the first coil segment 52 and the second coil segment 53 are arranged parallel to one another across a significant part of their longitudinal extension and are only separated from one another by the dielectric and form a capacitance.

Figure 3:
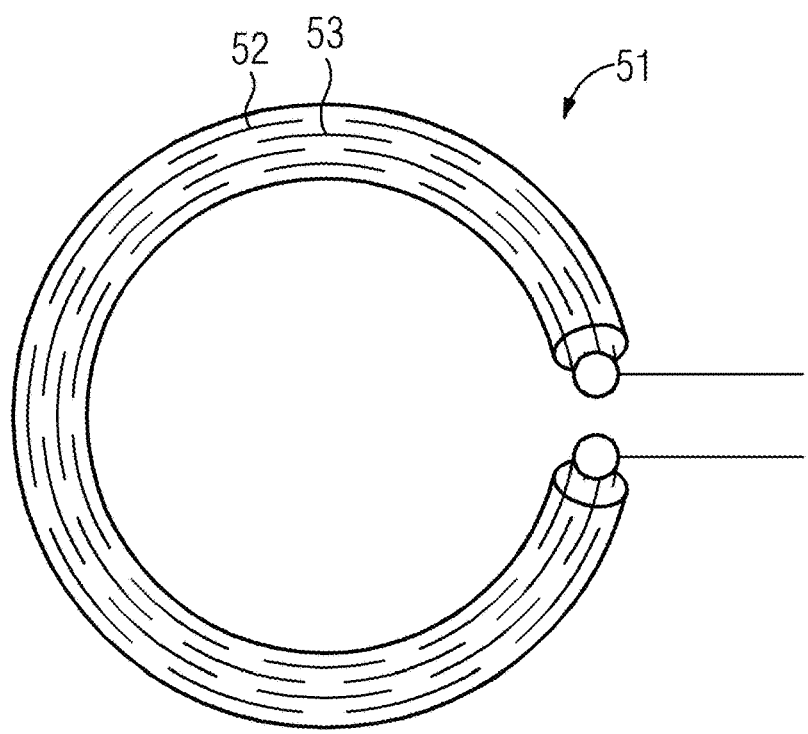
FIG. 3 depicts a schematic representation of a coil winding of a local coil according to an embodiment.

FIG. 3 depicts another embodiment of a coil winding 51 of a local coil. The coil winding 51 is formed by a bundle of conducting fibers. Contrary to a conventional, flexible line, that is formed from a number of parallel, thin wires and with which the individual wires normally extend across the entire length of the line and are ohmically in contact with one another, in the case of the coil winding of the coil winding of one or more of the present embodiments, the individual filaments that form the coil segments 52, 53 only extend over a fraction of the coil winding. For example, the filaments extend by less than 75%, 50%, 20%, or 10% of the length or periphery of the coil winding 51. The filaments are insulated ohmically from one another, for example, by an insulating varnish or a non-conducting matrix (e.g., a plastic resin), into which the filaments are embedded. The filaments may be employed on different layers of a multi-layer conductor board.

Figure 4:
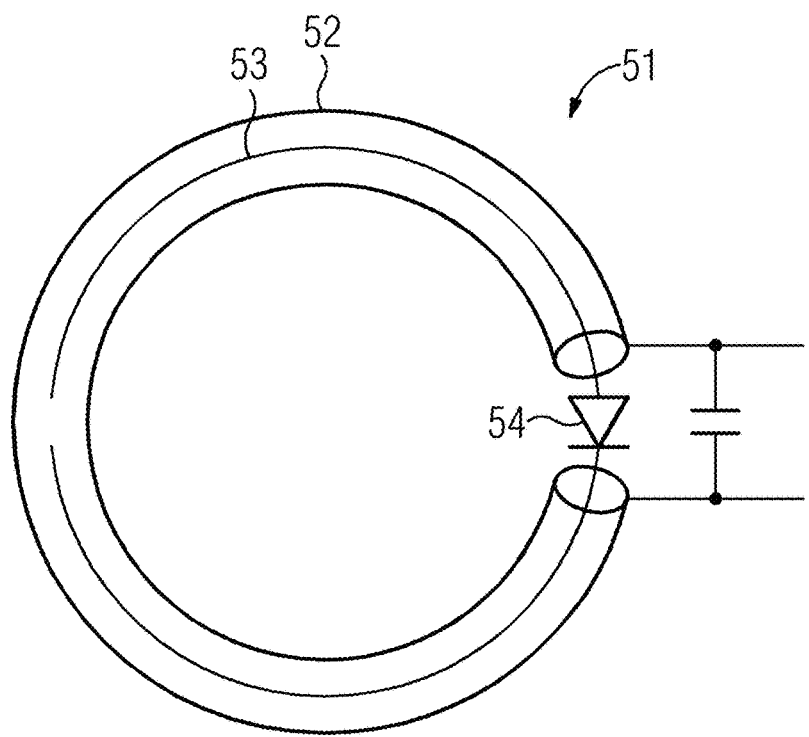
FIG. 4 depicts a schematic representation of a circuit for detuning a local coil according to an embodiment.

FIG. 4 depicts a coil winding 51 of a local coil 50 with a detuning device. The detuning device is composed of an inner inductance through the interrupted internal conductor of the coaxial cable as the second coil segment 53 and the PIN diode 54 as a switch.

Figure 5:
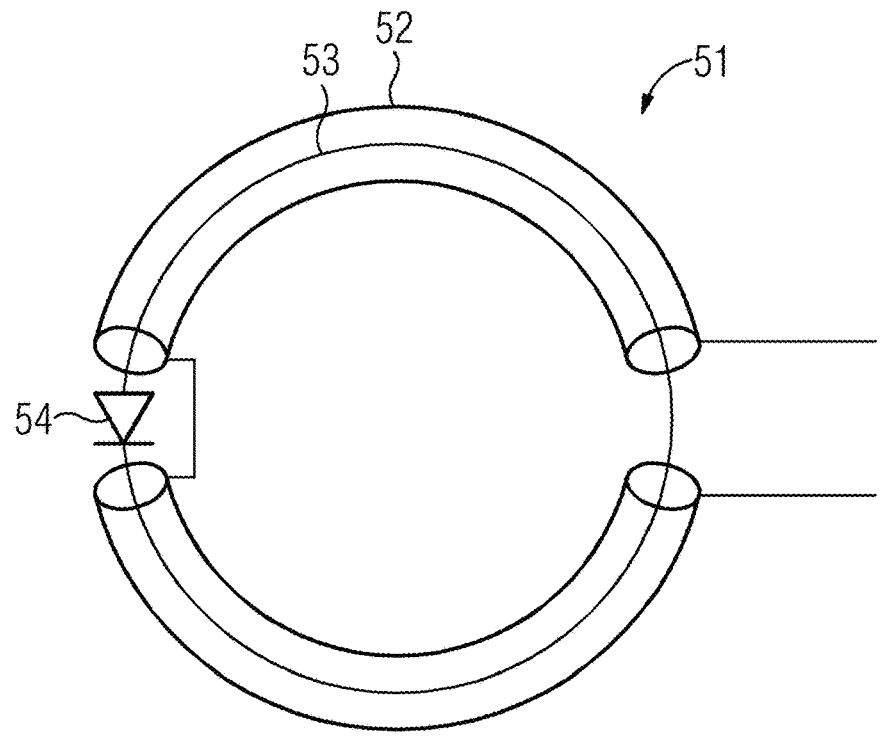
FIG. 5 depicts a schematic representation of a circuit for detuning a local coil according to an embodiment.

FIG. 5 depicts another variant of a detuning device. The external conductor is not interrupted, since there is an ohmic connection at the point at which the PIN diode 54 is arranged as a switch in the internal conductor. The capacitance is provided by the first coil segment 52 and the second coil segment 53 and may be left out as a separate component.

The PIN diode as a switch may also be provided by a micromechanical switch or electrostatic relay. A switch of this type is advantageous in that unlike with a PIN diode, a permanent current is not required for closure purposes, which provides circuits for detuning that, in the detuned state, require an open switch and in the resonant state a closed switch.

It is to be understood that the elements and features recited in the appended claims may be combined in different ways to produce new claims that likewise fall within the scope of the present disclosure. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present disclosure has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A local coil for a magnetic resonance tomography system, the local coil comprising:
   a coil winding, the coil winding comprising a plurality of coil segments of litz wire including a plurality of individual filaments that are insulated from one another and are repeatedly interrupted across a periphery of the coil winding so that the plurality of coil segments are coupled capacitively and not ohmically to one another.

2. The local coil of claim 1, wherein electrical conductors of at least two different coil segments of the plurality of coil segments are arranged adjacent to one another along a substantial portion of a longitudinal extent.

3. The local coil of claim 2, wherein the coil winding further comprises a coaxial cable, and
   wherein the electrical conductors of the at least two different coil segments comprise an external conductor and an internal conductor of the coaxial cable.

4. The local coil of claim 3, wherein the internal conductor of the coaxial cable is configured as a loop that is closed up to a point of interruption, and
   wherein the point of interruption is bridgeable by a closeable switch.

5. The local coil of claim 4, wherein the closeable switch is a PIN diode or a MEMS switch.

6. A magnetic resonance tomography system comprising:
   a local coil comprising:
      a coil winding, the coil winding comprising a plurality of coil segments of litz wire including a plurality of individual filaments that are insulated from one another and are repeatedly interrupted across a periphery of the coil winding so that the plurality of coil segments are coupled capacitively and not ohmically to one another.

7. The magnetic resonance tomography system of claim 6, wherein electrical conductors of at least two different coil segments of the plurality of coil segments are arranged adjacent to one another along a substantial portion of a longitudinal extent.

8. The magnetic resonance tomography system of claim 7, wherein the coil winding further comprises a coaxial cable, and
   wherein the electrical conductors of the at least two different coil segments comprise an external conductor and an internal conductor of the coaxial cable.

9. The magnetic resonance tomography system of claim 8, wherein the internal conductor of the coaxial cable is configured as a loop that is closed up to a point of interruption, and
   wherein the point of interruption is bridgeable by a closeable switch.

10. The magnetic resonance tomography system of claim 9, wherein the closeable switch is a PIN diode or a MEMS switch.

* * * * *